United States Patent [19]

Steinmaier

[11] 3,767,487

[45] Oct. 23, 1973

[54] METHOD OF PRODUCING IGFET DEVICES HAVING OUTDIFFUSED REGIONS AND THE PRODUCT THEREOF

[75] Inventor: Walter Steinmaier, Nijmegen, Netherlands

[73] Assignee: U.S. Philips Corporation, New York, N.Y.

[22] Filed: Nov. 5, 1971

[21] Appl. No.: 196,017

[30] Foreign Application Priority Data

Nov. 21, 1970 Netherlands ....................... 7017066

[52] U.S. Cl. ................. 148/191, 148/186, 147/187, 148/189, 148/33, 148/33.3, 317/235 R, 148/175

[51] Int. Cl. .......................... H01l 7/44, H01l 11/00

[58] Field of Search .................... 148/191, 186, 187, 148/189, 175; 317/235 B

[56] References Cited

UNITED STATES PATENTS

| | | | |
|---|---|---|---|
| 3,635,773 | 1/1972 | Thire | 148/191 |
| 3,183,128 | 5/1965 | Leistiko et al. | 148/186 |
| 3,544,858 | 12/1970 | Kooi | 317/235 B |
| 3,617,827 | 11/1971 | Schmitz et al. | 317/235 B |

*Primary Examiner*—G. T. Ozaki
*Attorney*—Frank R. Trifari

[57] ABSTRACT

A method of manufacturing a semiconductor device having an insulated gate field effect transistor in which a second region of the second conductivity type is indiffused in a first region of the first conductivity type and source and drain zones of the first conductivity type are provided in said second region. According to the invention, after the indiffusion, the doping material of the second region is outdiffused in an atmosphere of reduced pressure, preferably in a vacuum, in which a zone of maximum doping concentration is formed which may advantageously be used as a channel stopper and the source and drain zones are provided in the part of the second region having a doping concentration which increases from the surface. The method is preferably used for the manufacture of structures having complementary field effect transistors.

17 Claims, 14 Drawing Figures

*INVENTOR.*
WALTER STEINMAIER
*BY*
AGENT

INVENTOR.
WALTER STEINMAIER

BY Frank R. Trifari
AGENT

INVENTOR.
WALTER STEINMAIER
BY Frank R. Trifari
AGENT

INVENTOR.
WALTER STEINMAIER

BY
[signature]
AGENT

METHOD OF PRODUCING IGFET DEVICES HAVING OUTDIFFUSED REGIONS AND THE PRODUCT THEREOF

The invention relates to a method of manufacturing a semiconductor device comprising a semiconductor body having at least one insulated gate field effect transistor, in which in a first region of a first conductivity type adjoining a surface of the body there is provided a second region of the second conductivity type which also adjoins said surface and which forms with the first region a p-n junction which terminates at the surface, and in which the source and drain zones of a field effect transistor are provided in the second region. The invention furthermore relates to a semiconductor device manufactured by using this method.

Methods for the type described of manufacturing a semiconductor device having at least one insulated gate field effect transistor are known and are used in various embodiments. These methods are of importance, inter alia, because the structure obtained with such methods, in which the source and drain zones of the relevant field effect transistor are situated in a region which is surrounded by another region of the opposite conductivity type and is separated therefrom by a p-n junction, presents the possibility of realizing interesting and very advantageous semiconductor structures. Several semiconductor circuit elements may be provided in one and the same semiconductor body, separate circuit elements or groups of circuit elements mutually being separated electrically from each other within the semiconductor body. Very important are the possibility of providing field effect transistors of a complementary structure (n-p-n and p-n-p) in the same semiconductor body, and the possibility of manufacturing one or more bipolar transistors in the same body beside the relevant field effect transistor or field effect transistors simultaneously and without extra diffusion steps.

In a method as described above it is of very great importance that the second region in which an insulated gate field effect transistor is provided show an accurately defined, comparatively low surface concentration of the doping material determining the conductivity type of the second region, particulary in at least the part of this second region (the channel region) situated between the source and drain zones of the field effect transistor, while such surface concentration should also be very readily reproducible. Actually, already with very small differences in surface concentration, considerable differences occur in the threshold value of the voltage between the gate electrode and the channel region, the relevant field effect transistor changing from the non-conducting into the conducting state.

When using known methods, it has proved particularly difficult in practice to realize in a reproducible manner the low surface concentrations which are required for the most desirable threshold voltages, for example, between −3 volts and +3 volts.

According to a first known method, the second region is provided by diffusion of a doping material of the second conductivity type from the semiconductor surface in the first region of the first conductivity type. However, when using this method it is extremely difficult to obtain the desirable very low surface concentration ($10^{16}$ – $10^{17}$ atoms/ccm) for the doping of the second region in a reproducible manner. In this manner, higher surface concentrations ($10^{18}$ – $10^{20}$ atoms $cm^{-3}$) can be realized simply and in a reproducible manner, but these give rise to inadmissibly high threshold voltages of the field effect transistor.

According to a second known method, the second region is formed by providing locally on a substrate, a highly doped layer of the second conductivity type, after which a layer of the first conductivity type is grown epitaxially on the substrate and the highly doped layer. During such epitaxial growth or during a subsequent heating, the highly doped buried layer diffuses in the substrate and in the epitaxial layer up to the surface. As a result of such diffusion, the conductivity type of the epitaxial layer is locally inverted above the buried layer, as a result of which the second region of the second conductivity type is formed having a comparatively low doping concentration at the semiconductor surface. Not counting the fact that it is necessary to provide an epitaxial layer and a buried layer with a suitable doping material, an important drawback of this method is that the reproducibility of the resulting low surface concentration is inter alia strongly dependent upon the reproducibility of the thickness of the epitaxial layer through which the diffusion from the buried layer takes place. A small difference in this thickness may result in an inadmissible deviation in the surface concentration and hence in the threshold voltage of the field effect transistor, A common drawback of the two above described known methods is furthermore that, when a sufficiently low surface doping of the second region is achieved, the concentration is so low that inversion channels can easily be formed at the surface, for example below an oxide layer, whether or not under the influence of an electric field induced by a metal layer situated on the oxide layer.

According to a third known method, a doping material of the second conductivity type is locally provided on the semiconductor surface of a region of the first conductivity type while using a first mask, after which a second mask having an aperture within the doped surface region is provided on the doped region and the doping material is then indiffused by heating in moist oxygen. During the diffusion an oxide layer is formed on the surface within the aperture, in which layer a part of the doping material is incorporated. As a result of this a region of the second conductivity type is formed which is thicker at the edge and has a higher surface concentration than below the aperture. In the region of comparatively low surface concentration below the aperture, source and drain zones of a field effect transistor may then be provided.

In addition to the fact that the thickness of the region of the second conductivity type obtained by using the last-mentioned method is inhomogeneous and that the use of two masks is indispensable, it is difficult to obtain the desirable low surface concentrations by diffusion in an oxidizing atmosphere in a reproducible manner.

One of the objects of the present invention is to provide a new and simple method in which the drawbacks involved in the known methods are avoided or are at least considerably reduced.

For that purpose the invention is based inter alia on the recognition of the fact that by first indiffusing the doping material entirely and then partly out-diffusing it in an atmosphere of reduced pressure the desirable concentration profile can be obtained with the simultaneous formation of a channel-interrupting border zone, all this if desirable while using only one mask and without the use of an epitaxial layer, while conventionally used diffusion steps and diffusion concentrations are used for the doping.

A method of the type mentioned in the preamble of manufacturing a semiconductor device is therefore characterized according to the invention in that, in order to form the second region, a doping material determining the second conductivity type is introduced in the first region from the semiconductor surface, after which the doping material is partially diffused out from the semiconductor body in a space having an atmosphere of reduced pressure over at least a part of the semiconductor surface occupied by the second region, as a result of which the concentration of the doping material in a zone of the second region situated between the semiconductor surface part from which the outdiffusion took place and the first region shows a maximum value, and that the source and drain zones of the first conductivity type are provided at least partly in the part of the second region in which, as a result of the outdiffusion, the doping concentration increases from the semiconductor surface — hereinafter termed the part having a positive doping gradient.

By using the method according to the invention, a second region of the second conductivity type is obtained which shows a readily defined, reproducible, low surface concentration at least over a part of its surface as a result of which the threshold voltage of the field effect transistor or field effect transistors provided in this region is also very readily controllable and reproducible. Such a reproducible and comparatively low surface concentration which is hard to achieve according to known methods can be realized in a simple manner according to the invention by outdiffusion under reduced pressure.

The reduced pressure may be given various values while the atmosphere in which the outdiffusion takes place may have a variety of compositions. According to the invention, however, the best results are obtained when the outdiffusion is carried out in a vacuum. Furthermore, a quantity of semiconductor material is preferably provided in the space containing the atmosphere of reduced pressure (and vacuum, respectively), which quantity is substantially free from the doping material to be outdiffused, so as to prevent material of the semiconductor body from evaporating partly.

When the doping material is outdiffused over only a part of the surface of the second region, the part having a positive doping gradient will be bounded by a part of the second region having a higher surface concentration in which the doping concentration decreases at a substantially uniform rate from the said surface part. The source and drain zones of the field effect transistor may be provided partly in the part having a higher surface concentration, on the understanding that the region between the source and drain zones belongs to the part having a low surface concentration and a positive doping gradient. Preferably, however, the source and drain zones of the first conductivity type are provided entirely in the part having a positive doping gradient of the second region, these zones being surrounded entirely by the positive doping gradient part within the body. As a result of this, the breakdown voltage between the source and drain zones and the second region is high, which is desirable in most of the cases.

In those cases in which the doping material is outdiffused only over a part of the semiconductor surface occupied by the second region, at least the edge of the surface part occupied by the second region is preferably covered by a masking layer during the outdiffusion, the masking layer impeding the outdiffusion of the doping material from the semiconductor surface. The edge of the second region covered by the masking layer thereby obtains a high doping concentration at the surface as a result of which the formation of inversion channels at the surface between the first and the second region is prevented or at least seriously impeded. The introduction and outdiffusion of the doping material of the second conductivity type may advantageously be carried out while using the same diffusion mask, as a result of which a minimum of masking steps is required.

According to a further preferred embodiment, the doping material is outdiffused over at least two mutually separated parts of the semiconductor surface occupied by the second region, and the source and drain zones of an insulated gate field effect transistor are provided in each of these parts. For example, several field effect transistors may be formed within the second region, which transistors are each surrounded by a surface part of the second region from which no outdiffusion has taken place and of which consequently the surface concentration is sufficiently high to avoid the formation of inversion channels between the field effect transistors.

According to a very important preferred embodiment, a complementary insulated gate field effect transistor having source and drain zones of the second conductivity type adjoining the surface is provided in the first region of the first conductivity type beside the second region of the second conductivity type. The present invention provides a very simple and efficacious method of realizing in a reproducible manner such structures having complementary field effect transistors which may be used in many important circuit arrangements. In this preferred embodiment the second region itself may furthermore constitute advantageously a source or drain zone of the complementary field effect transistor so that only one further electrode zone of the complementary transistor need be provided in addition to the gate electrode therefor.

The method according to the invention inter alia has the important advantage that it can be combined in an advantageous manner with the manufacture of bipolar structures without extra indiffusion steps being necessary. According to a further preferred embodiment, there is provided in the first region beside the second region a bipolar transistor, of which the base zone is provided simultaneously with the second region and the emitter zone is provided simultaneously with the source and drain zones of the field effect transistor in the second region.

The second region may be surrounded partly by the first region and adjoin for the remaining part, for example, a substrate region of the second conductivity type. According to an important preferred embodiment, however, the second region is surrounded entirely by the first region within the semiconductor body so that the p-n junction between the first and the second region terminates at the surface of the semiconductor body. The second region may then form, for example, in itself an island of an integrated monolithic circuit insulated by the p-n junction.

Another important preferred embodiment in which the first region is an epitaxial layer of the first conductivity type provided on a substrate region of the second conductivity type, which layer is divided into islands by isolation zones of the second conductivity type extending from the surface to the substrate region, the isolation zones and the second region being provided simultaneously in the same diffusion step by indiffusion of a doping material determining the second conductivity type. When manufacturing a monolithic integrated circuit while using the method according to the invention this provides a saving of a diffusion step.

A very important advantage of the present invention, in particular when using the preferred embodiments of manufacturing a monolithic integrated circuit, is that start may be made from the standard diffusions, with comparatively high surface concentrations conventional for the manufacture of the rest of the circuit so that besides the outdiffusion few or no processing steps are necessary.

Although the second region may be of the n-conductivity type in which a donor is introduced to form the second region, a p-type conductive second region is preferably formed by introduction of an acceptor. It has actually been found in practice, in particular when the semiconductor body consists of silicon, that in order to obtain an insulated gate p-n-p field effect transistor having the desirable threshold voltage, a considerably lower surface concentration of the (n-type) channel region is required than in an n-p-n field effect transistor. This is related to the fact that when conventional masking and diffusion techniques are used, the electrostatic charge in the resulting oxide is positive so that a negative surface charge is induced in the underlying surface of the semiconductor body. This is the case in particular in the system silicon-silicon oxide.

According to an important preferred embodiment in which the semiconductor body consists of silicon, boron is used as an acceptor impurity to form the second region. Boron has proved to be particularly suitable to obtain the desirable low surface concentration by using the outdiffusion process described. An important preferred embodiment to obtain a field effect transistor having a threshold voltage of at most 3 volts which is in addition surrounded by a channel interrupting zone, is characterized according to the invention in that the surface concentration of the boron during the introduction and the time and temperature of the outdiffusion are chosen to be so that after the outdiffusion the maximum doping concentration in the second region is at least equal to $10^{18}$ atoms/ccm and that the doping concentration at the surface part of the second region across which the outdiffusion took place is at most equal to $5 \times 10^{16}$ atoms/ccm.

The invention furthermore relates to a semiconductor device manufactured by using the method described.

In order that the invention may be readily put into effect, a few embodiments thereof will now be described in greater detail, by way of example, with reference to the accompanying drawing, in which FIG. 1 is a diagrammatic plan view of a device manufacturing by using the method according to the invention, FIG. 2 is a diagrammatic cross-sectional view taken on the line II—II of the device shown in FIG. 1;

The drawings are diagrammatic and not to scale; this applies in particular to the dimensions in the direction of thickness and to the thicknesses of the insulating layers. Corresponding components in the Figures are referred to by the same reference numerals as much as possible.

Figure 1:
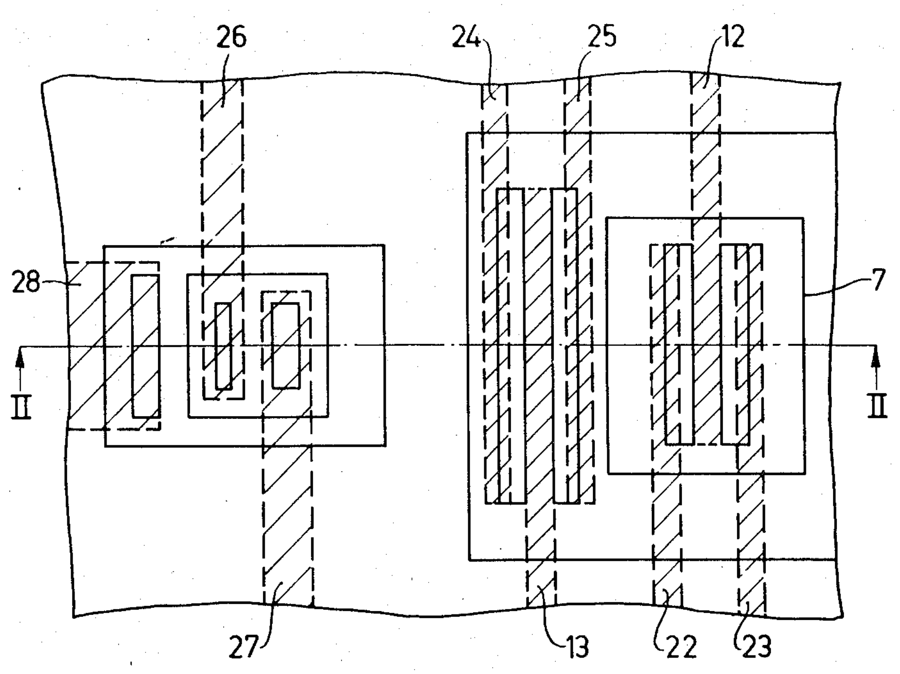
Figure 2:
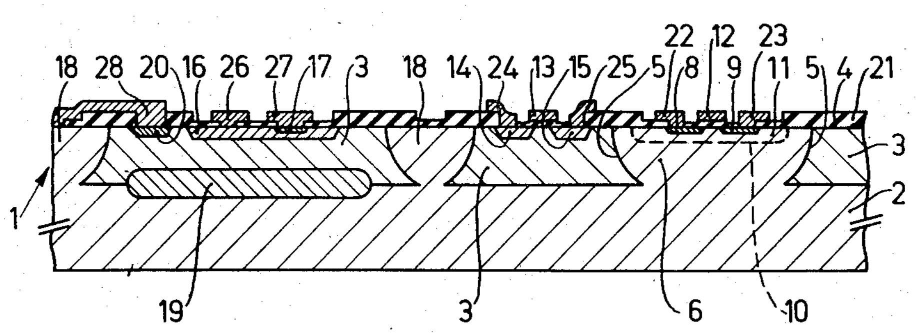

FIG. 1 is a diagrammatic plan view and FIG. 2 a diagrammatic cross-sectional view taken on the line II—II of FIG. 1 of a semiconductor device manufactured by using the method according to the invention. The device comprises a semiconductor body 1 of silicon consisting of a p-type substrate region 2 on which an epitaxial n-type layer is grown which constitutes a first region 3 adjoining a surface 4 of the body. A p-type conductive second region 6 which also adjoins the surface 4 constitutes with the first region 3 a p-n junction 5 which terminates at the surface 4 as shown by the line 7 (FIG. 1).

N-type source and drain zones 8 and 9 of an (n-p-n) insulated gate field effect transistor, which includes a gate electrode 12, are provided in the second region 6. The p-type second region 6 has a doping concentration which is maximum in a zone on and near the surface 10 which is shown in broken lines in the Figures. The doping concentration in the part 11 of the second region 6, which part 11 is between the surface of maximum doping concentration 10 and the semiconductor surface 4, increases inwards from the surface 4; this part 11 is therefore termed the part having a positive doping gradient. The source zone 8 and the drain zone 9 are both situated entirely in the part 11 of the region 6 and are entirely surrounded within the body by the part 11.

A complementary (p-n-p) field effect trnasistor having an insulated gate electrode 13 and p-type source and drain zones 14 and 15 is provided in the first region 3 beside the second region 6. Furthermore a bipolar transistor having a p-type base zone 16 and an n-type emitter zone 17 is provided in an island-shaped part of the region 3 which is separated by in-diffused p-type isolation zones 18 from the remaining part of the region 3 and constitutes the collector zone of the bipolar transistor. The collector zone comprises a highly doped n-type buried layer 19, a portion of region 3 and a highly doped n-type contact zone 20 to reduce the collector resistance.

The semiconductor surface 4 is covered with a silicon oxide layer 21 and the zones 8, 9, 14, 15, 16, 17 and 20 are contacted via windows in the oxide layer 21 by means of aluminium layers 22, 23, 24, 25, 26, 27 and 28. The gate electrodes 12 and 13 are also constituted by aluminium layers. The two gate electrodes and the bipolar transistor together form part of a monolithic integrated semiconductor circuit.

Figure 3:
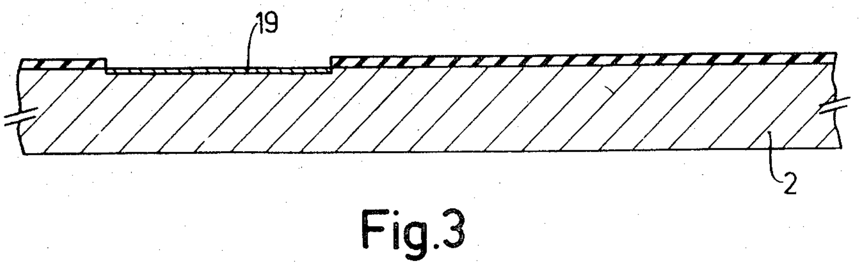
FIGS. 3 to 8 are diagrammatic cross-sectional views taken on the line II—II of the device shown in FIG. 1 in successive stages of manufacture.
Figure 4:
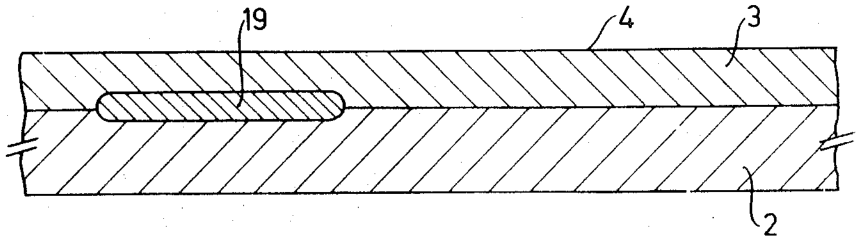

According to the invention the device described is manufactured in the following manner (see FIGS. 3 to 8). Starting material (see FIG. 3) is a p-type silicon substrate 2, having a resistivity of about 5 ohm.cm. and a thickness of about 200 microns. After having made a (111) surface of the substrate free from crystal defects as readily as possible by polishing and etching, the surface is thermally oxidized. An aperture is then etched in the resulting oxide layer and arsenic is diffused in the aperture to form an n-type layer 19 having a sheet resistance of about 20 ohm per square (FIG. 3). The oxide is then removed and an n-type silicon layer 3 having a thickness of about 5 microns and a resistivity of about 3ohm.cm is grown on the substrate 2, e.g., by using conventional epitaxial growing methods. During the growing operation the layer 19 partly diffuses in the substrate 2 and partly in the layer 3 (FIG. 4).

Figure 5:
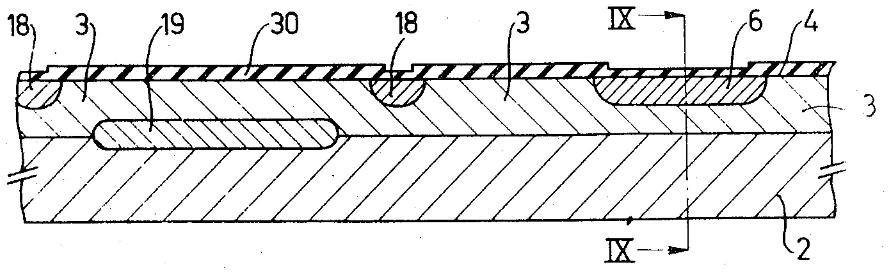

An oxide layer 30, about 0.9 micron thick, is obtained on the surface 4 of the layer 3 by thermal oxidation. Apertures are etched in the oxide layer 30 by means of known photolithographic etching methods. Boron is diffused in the apertures, p-type zones 18 and 6 being formed (FIG. 5). The surface concentration of the boron diffusion gives a sheet resistance of about 150 ohm per square. During the diffusion, a layer of boro-silicate glass is formed within the apertures.

By a superficial etching treatment the oxide-glass layer 30 is etched away through part of its thickness over the whole surface until there is exposed the semiconductor surface within the diffusion windows through which the zones 6 and 18 were indiffused. The remaining oxide has a thickness of approximately 0.4 micron.

The silicon plate is now placed in a quartz glass ampoule (not shown) in which pure undoped silicon powder is provided. The ampoule is evacuated and sealed. For outdiffusion, the ampoule is then heated in a furnace at a temperature of 1,200°C for 4 hours. Boron diffuses out of the surface to the exterior from the parts of the diffused regions 6 and 18 not covered by oxide. The outdiffused boron is taken up partly in the silicon powder and partly in the wall of the quartz ampoule. As a result of the presence of the silicon powder, a certain silicon vapour pressure prevails in the ampoule which counteracts the evaporation of silicon at the surface. The outdiffusion of boron from the region 6 occurs in this case via the same aperture in the oxide layer through which the boron was first indiffused so that no extra mask is necessary for this outdiffusion. During the outdiffusion, the edge of the surface occupied by the region 6, which edge is formed during the indiffusion by the lateral diffusion below the edge of the diffusion mask, is covered with an oxide layer masking against the outdiffusion.

Figure 6:
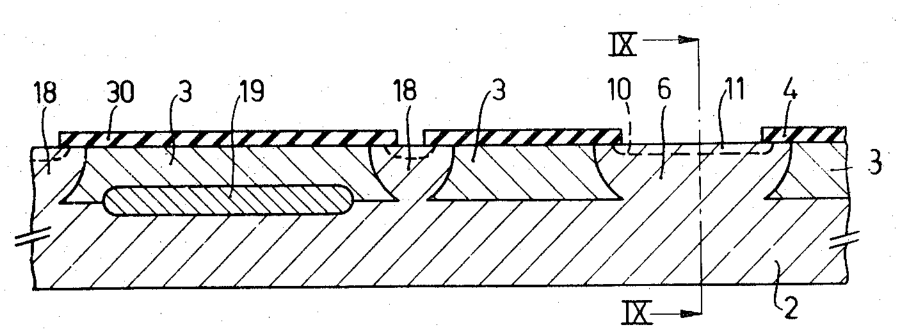
Figure 7:
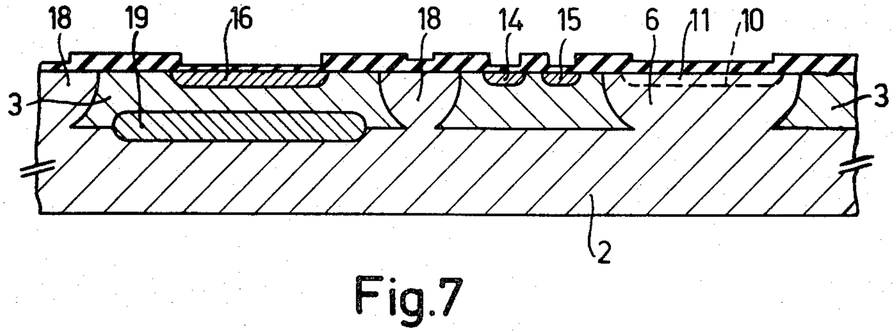
Figure 8:
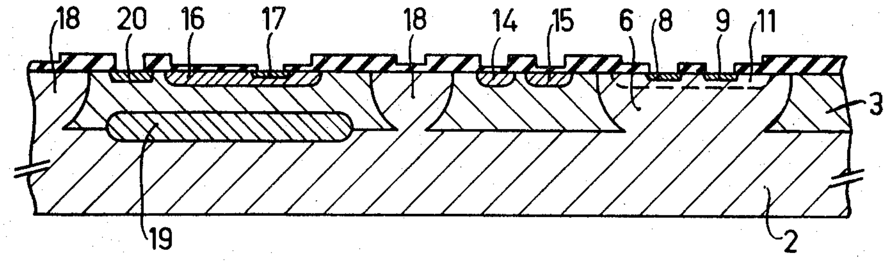

The condition after the outdiffusion is shown in FIG. 6. The zones 6 and 18 extend throughout the thickness of the epitaxial layer 3, the zones 18 constituting isolation zones which divide the layer 3 into islands. By the outdiffusion of boron, a narrow zone of maximum boron concentration has been formed in the region 6 between the exposed part of the surface 4 and the region 3, this maximum concentration zone being located on and in the immediate proximity of the surface 10 which is denoted in the Figures by broken lines and which extends up to the surface 4. The boron concentration decreases from the maximum dopant concentration zone, which is located at the surface 10, towards both sides and the part 11 of the region 6 has a doping concentration which increases from the surface inwardly, in other words the part 11 has a positive doping gradient.

Figure 9:
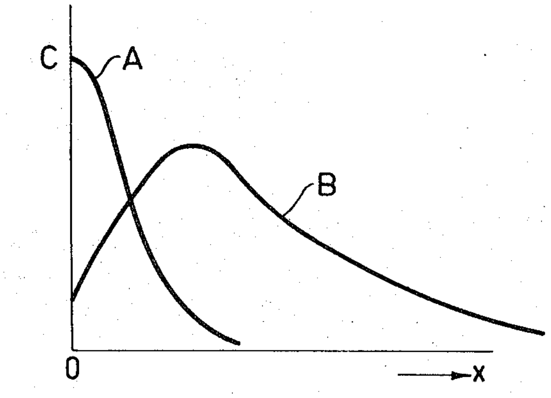
FIG. 9 shows the doping profile taken on the line IX—IX of FIGS. 5 and 6 prior to and after the outdiffusion.

After the outdiffusion, the boron concentration at the surface of the region 6 within the window through which the outdiffusion took place is approximately $5\times10^{16}$ atoms/ccm and the concentration of the parts of the region 6 below the oxide layer, where substantially no outdiffusion took place, is approximately $2\times10^{18}$ atoms/ccm. This latter doping concentration is sufficient to prevent an inversion layer from being formed at the area in the region 6 below the oxide layer. FIG. 9 shows diagrammatically the variation of the boron concentration C with the depth $x$ below the surface 4 taken on the line IX—IX of FIGS. 5 and 6, A being the profile prior to the outdiffusion and B being the profile after the outdiffusion. The zone of maximum boron concentration is approximately 1.4 microns below the semiconductor surface.

After closing the apertures in the oxide layer by thermal oxidation, in which a 0.3 micron thick oxide layer is formed, and etching new diffusion windows, the base zone 16 and the source and drain zones 14 and 15 (FIG. 7) are simultaneously formed by a boron diffusion with a surface concentration of $5\times10^{18}$ atoms/ccm and a depth of penetration of about 1.5 microns (sheet resistance about 200 ohm per square),. The emitter zone 17, the collector contact zone 20 and the source and drain zones 8 and 9 (FIG. 8), are then provided by a phosphorus diffusion (sheet resistance about 5–6 ohm per square, depth of penetration about 1 micron). These latter zones 8 and 9 lie entirely in the part 11 having a positive doping gradient and are fully surrounded by the part 11.

Finally the oxide is removed at the area of the gate electrodes to be provided and is replaced by a new layer of thermally grown oxide about 0.1 micron thick (oxidation at 1,000°C in moist oxygen for 30 minutes). After etching contact windows the aluminium layers 12, 13 and 22 to 28 are then provided by using conventional vapour deposition and masking methods.

Since the source and drain zones 8 and 9 adjoin only comparatively low-doped p type material, the breakdown voltage between these zones and the region 6 is high (approximately 20 volts). As a result of the comparatively high surface concentration of the zone at the surface 10, shortcircuit between the zones 8 and 9 and the region 3 via inversion channels is avoided. According to the method described, various respective elements of the bipolar transistor (17, 16, 3) and the complementary field effect transistors (8, 9, 12) and (14, 15, 13) can be manufactured simultaneously while using normal standard diffusion, using as an extra step only an outdiffusion. The field effect transistor (8, 9, 12) has threshold voltage of +1½ volt and the field effect transistor (14, 15, 13) has threshold voltage of −1½ volt (gate electrode voltage relative to the channel region).

A few other semiconductor devices manufactured according to the invention are shown in FIGS. 10 to 14. In these Figures, the components which correspond to components of the device of the previously described embodiment are referred to by the same reference numerals.

Figure 10:
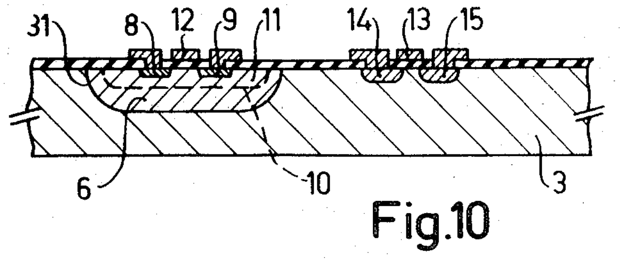
FIGS. 10 to 14 are diagrammatic cross-sectional views of other devices manufactured by using the method according to the invention.

FIG. 10 shows a structure having two complementary insulated gate field effect transistors of which the n-type source and drain electrodes 8 and 9 of the n-p-n field effect transistor are provided in the outdiffused part 11 having a positive doping gradient of the p-type second region 6, region 6 is diffused in the n-type first region 3 and is entirely surrounded by the region 3 without the use of an epitaxial layer. In addition to the n-p-n transistor (8, 9, 12) a complementary field effect transistor (14, 15, 13) is provided in the region 3 and is insulated from the field effect transistor (8, 9, 12) by the p-n junction 31 between the regions 3 and 6, while the zone of maximum doping concentration (located at the surface 10) extending up to the surface 4 serves as a channel stopper and prevents the formation of an n-type inversion channel between the region 3 and the source and drain zones 8 and 9.

Figure 11:
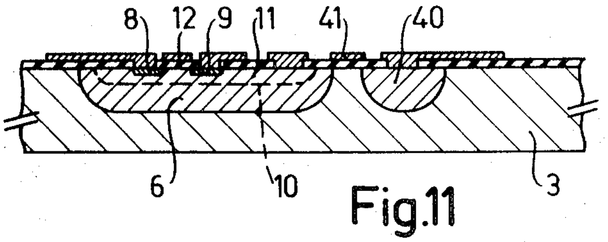

FIG. 11 shows a variation of the above-described described structure in which the source and drain zones of the complementary field effect transistor are constituted by, respectively, the region 6 and a further p-zone 40 which, if desirable, may be provided simultaneously with the region 6 in the same diffusion step. The gate electrode 41 of the complementary transistor is provided between the zones 6 and 40 on the insulating layer.

Figure 12:
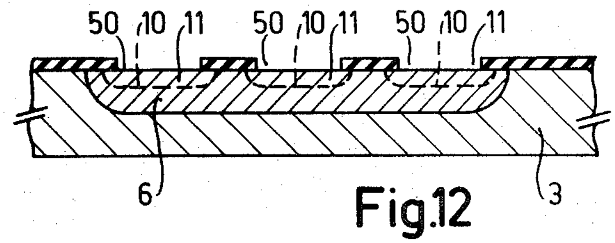
Figure 13:
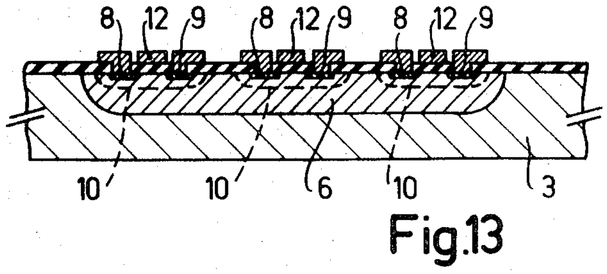

FIGS. 12 and 13 show a device in which several field effect transistors are provided in the region 6. As shown in FIG. 12, after the indiffusion of the region 6 several windows 50 are etched in the oxide layer on the surface by an extra masking and etching step, after which the outdiffusion takes place via the windows 50. Source and drain zones (8, 9) are then provided (see FIG. 13) in each of the resulting regions 11 having a positive doping gradient so as to form several field effect transistors in the same region 6 which are each surrounded by a channel stopper zone having a comparatively high surface concentration which prevents short-circuit via an inversion layer between source and drain zones of various transistors.

Figure 14:
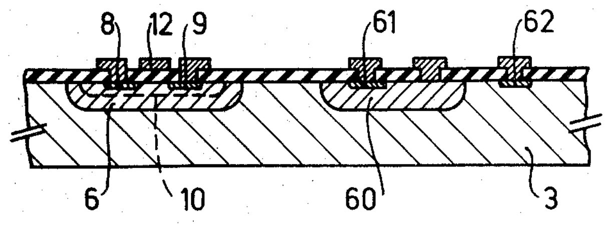

FIG. 14 finally shows a device in which, beside the second region 6 in the first region 3, a zone 60 of the same conductivity type as the region 6 is provided, which zone 60 constitutes the base zone of a bipolar transistor having an emitter zone 61 and a collector contact zone 62. The zone 60 is advantageously provided simultaneously with the region 6, and the zones 61 and 62 are advantageously provided simultaneously with the source and drain zones 8 and 9.

All the devices described may be manufactured while using the same methods which were described in the embodiment shown in FIGS. 1 to 9, in which, for the manufacture of a device of the type of FIGS. 12 and 13, an extra masking and etching step is necessary.

Although in the description of the above-mentioned embodiments the starting material was a structure in which the region 6 is of p-type conductivity, the conductivity types may of course be replaced, if desirable, by their opposite conductivity types while using the same methods. The outdiffusion may furthermore be carried out in an atmosphere of low pressure other than a vacuum. Furthermore, if this should be desirable, for example, from a point of view of space saving, the source and drain zones 8 and 9 may be partly provided in parts of the region 6 outside the parts having a positive doping gradient, although as a result of this the breakdown voltage between the source and drain zones (8, 9) and the region 6 decreases. The whole surface of the region 6 may also be exposed prior to the outdiffusion as a result of which the outdiffusion takes place throughout the surface.

It will furthermore be obvious that the invention is not restricted to the embodiments described, but that many variations are possible to those skilled in the art without departing from the scope of this invention. For example, in particular semiconductor materials other than silicon, for example germanium and III–V compounds, for example gallium arsenide, other insulating layers than silicon, for example, silicon nitride, aluminium oxide or composite layers of two or more different materials on each other, and other metal layers may be used. The gate electrodes of some or of all the field effect transistors may also advantageously consist of other materials, in particular, polycrystalline silicon, instead of metal. Furthermore, other geometric structures may be used and in addition to insulated gate field effect transistors and bipolar transistors, other semiconductor circuit elements may be provided in the semiconductor body. Moreover the introduction of the doping material determining the second conductivity type prior to the outdiffusion may be carried out by other methods than indiffusion, for instance by ion implantation.

What is claimed is:

1. A method of producing a semiconductor device comprising at least one insulated gate field effect transistor, comprising the steps of:

a. providing a semiconductor body comprising a first surface region having a first conductivity type;

b. forming in said first region a second region of a second opposite conductivity type, said second region being formed by introducing a second conductivity type doping material into said first region from a part of the semiconductor surface, said second region comprising a surface part extending over substantially all of said second region; said first and second regions froming a p-n junction;

c. treating said second region to partially diffuse out said second conducdivity type doping material from at least a portion of said surface part located at said second region, said out-diffusing treating being carried out in a space having a reduced pressure atmosphere, thereby producing in said second region a zone that has a maximum concentration of said second conductivity type doping material contained in said second region and that is located entirely within said second region, with the portion of said second region located between said semiconductor surface and said maximum concentration zone exhibiting a positive doping concentration gradient which increases from said semiconductor surface toward said maximum concentration zone; and d. providing in said second region spaced source and drain zones of said first conductivity type to define therebetween a channel zone, said source and drain zones being located at least partly in said positive doping concentration gradient portion and said channel zone being located completely in said positive doping concentration gradient portion.

2. A method as recited in claim 1, wherein said second conductivity type doping material is outdiffused in a vacuum.

3. A method as recited in claim 1, wherein said space contains semiconductor material which is substantially free from said second conductivity type doping material.

4. A method as recited in claim 1, wherein said source and drain zones of said first conductivity type are provided entirely in said positive dopant gradient portion of said second region.

5. A method as recited in claim 1, wherein said second conductivity type doping material is outdiffused from only said portion of said surface part located at said second region and at least the edge of said surface part is covered by a masking layer during said outdiffusion step, said masking layer impeding the outdiffusion of said second conductivity type doping material from said edge.

6. A method as recited in claim 5, wherein said introduction and outdiffusion of said second conductivity type doping material are carried out while using the same diffusion mask.

7. A method as recited in claim 5, wherein said second conductivity type doping material is outdiffused from at least two mutually separate portions of said surface part located at said second region and source and drain zones of various insulated gate field effect transistors are provided in respective ones of said portions.

8. A method as recited in claim 1, comprising the steps of providing a complementary insulated gate field effect transistor in said first region, said complementary transistor comprising source and drain zones of said second conductivity type adjoining said semiconductor surface and said first region adjoining said second region.

9. A method as recited in claim 8, wherein said second region constitutes one of a source and drain zone of said complementary field effect transistor.

10. A method as recited in claim 1, comprising the steps of simultaneously providing in said semiconductor body a base zone for a bipolar transistor and said second region and simultaneously providing in said semiconductor body an emitter zone for said bipolar transistor and said source and drain zones located in said second region.

11. A method as recited in claim 1, wherein said second region is laterally surrounded entirely by said first region within said semiconductor body.

12. A method as recited in claim 1, wherein said semiconductor body comprises a substrate region of said second conductivity type and said first surface region comprises an epitaxial layer of said first conductivity type, said method comprising the further step of forming isolation zones in said layer so as to devide said layer into islands, said isolation zones being of said second conductivity type and extending from said surface to said substrate region, said isolation zones and said second region being provided simultaneously in the same diffusion step by indiffusion of said second conductivity type doping material.

13. A method as recited in claim 1, wherein said second conductivity type material is an acceptor impurity.

14. A method as recited in claim 13, wherein said semiconductor body consists essentially of silicon.

15. A method as recited in claim 14, wherein the surface concentration of the acceptor impurity which is boron during the introduction into said surface region and the time and temperature of the outdiffusion are chosen to be so that after the outdiffusion step of the maximum doping concentration in said second region is at least $10^{18}$ atoms/ccm and that the doping concentration at said surface part of said second region at which outdiffusion took place is at most equal to $5 \times 10^{16}$ atoms/ccm.

16. A method as recited in claim 1, further comprising the step of forming over said channel region a gate electrode consisting essentially of polycrystalline silicon.

17. A semiconductor device produced according to the method recited in claim 1.

* * * * *